(12) United States Patent
Kanie et al.

(10) Patent No.: US 9,083,333 B2
(45) Date of Patent: Jul. 14, 2015

(54) SWITCHING CIRCUIT

(75) Inventors: Naohito Kanie, Kariya (JP); Toshiaki Nagase, Kariya (JP)

(73) Assignee: KABUSHIKI KAISHA TOYOTA JIDOSHOKKI, Kariya-Shi (JP)

( * ) Notice: Subject to any disclaimer, the term of this patent is extended or adjusted under 35 U.S.C. 154(b) by 80 days.

(21) Appl. No.: 13/483,391

(22) Filed: May 30, 2012

(65) Prior Publication Data

US 2012/0313184 A1 Dec. 13, 2012

(30) Foreign Application Priority Data

Jun. 7, 2011 (JP) ................................. 2011-127614

(51) Int. Cl.
*H03K 17/00* (2006.01)
*H03K 17/082* (2006.01)
*H02M 1/32* (2007.01)
*H03K 17/12* (2006.01)
*H03K 17/16* (2006.01)
*H02M 1/088* (2006.01)

(52) U.S. Cl.
CPC ........... *H03K 17/0822* (2013.01); *H02M 1/088* (2013.01); *H02M 1/32* (2013.01); *H03K 17/122* (2013.01); *H03K 17/165* (2013.01)

(58) Field of Classification Search
CPC ............................ H03K 17/162; H03K 17/687
USPC ........................................................ 307/113
See application file for complete search history.

(56) References Cited

U.S. PATENT DOCUMENTS 4,647,848 A * 3/1987 Barrett .............................. 324/95
4,939,485 A * 7/1990 Eisenberg ...................... 333/104
5,023,494 A * 6/1991 Tsukii et al. .................... 327/427
5,124,595 A * 6/1992 Mandelcorn ................... 327/434
5,416,387 A * 5/1995 Cuk et al. ..................... 315/209 R
5,563,545 A * 10/1996 Scheinberg ..................... 327/389
5,739,717 A * 4/1998 Nakamura ...................... 327/514

(Continued)

FOREIGN PATENT DOCUMENTS

JP 01-243721 A 9/1989
JP 02-207617 8/1990

(Continued)

OTHER PUBLICATIONS

Japanese Office Action with English Summary for Japanese Patent Application 2011-127614 mailed on Jul. 16, 2013.

(Continued)

*Primary Examiner* — Adi Amrany
(74) *Attorney, Agent, or Firm* — Yoshida & Associates, LLC

(57) ABSTRACT

A switching circuit (80) includes: a plurality of insulated gate transistors (30-33) connected in parallel between a high voltage line (L1) and a low voltage line (L2); gate resistors (50-53) each provided for one of the plurality of insulated gate transistors (30-33) and each including a first terminal connected to the gate electrode of each of the insulated gate transistors (30-33); and a single gate voltage application unit (60) configured to apply pulsing gate voltage to the gate electrode of each of the insulated gate transistors (30-33) via the gate resistors (50-53). A second terminal of each of the gate resistors (50-53) provided for each of the plurality of insulated gate transistors (30-33) is connected to the gate voltage application unit (60) via a gate voltage apply line (L3), and a single capacitor is connected between the gate voltage apply line (L3) and the high voltage line (L1).

8 Claims, 3 Drawing Sheets

(56) References Cited

U.S. PATENT DOCUMENTS

| | | | |
|---|---|---|---|
| 5,744,823 A * | 4/1998 | Harkin et al. | 257/68 |
| 5,946,178 A * | 8/1999 | Bijlenga | 361/91.5 |
| 6,054,899 A * | 4/2000 | Ke | 330/278 |
| 6,373,731 B1 * | 4/2002 | Iwamura et al. | 363/56.05 |
| 6,490,182 B2 * | 12/2002 | Katoh et al. | 363/56.05 |
| 6,614,633 B1 * | 9/2003 | Kohno | 361/56 |
| 6,829,152 B2 * | 12/2004 | Miura et al. | 363/40 |
| 7,026,858 B2 * | 4/2006 | Tosaka | 327/427 |
| 2003/0107905 A1 * | 6/2003 | Miura et al. | 363/41 |
| 2008/0012610 A1 * | 1/2008 | Aoki et al. | 327/109 |
| 2008/0054325 A1 * | 3/2008 | Takahashi et al. | 257/299 |
| 2013/0021700 A1 * | 1/2013 | Greither | 361/56 |

FOREIGN PATENT DOCUMENTS

| | | | | |
|---|---|---|---|---|
| JP | 02-207617 A | | 8/1990 | |
| JP | 2004-072811 A | | 3/2004 | |
| JP | 2005261012 A | * | 9/2005 | H02P 7/29 |
| JP | 2008-35621 A | | 2/2008 | |
| JP | 2009225648 A | * | 10/2009 | |
| JP | 2009-296216 A | | 12/2009 | |
| WO | 2005/022747 A1 | | 3/2005 | |

OTHER PUBLICATIONS

Japanese Notice of Allowance with English Summary for Japanese Patent Application 2011-127614 mailed on Jul. 16, 2013.

Japanese Office Action with English Summary for Japanese Patent Application 2011-127614 mailed on Apr. 23, 2013.

European Search Report (in English) corresponding to European Patent Application No. 12170644.4-1809 mailed on Aug. 21, 2014.

* cited by examiner

SWITCHING CIRCUIT

BACKGROUND OF THE INVENTION

The present invention relates to a switching circuit.

A switching circuit used in a DC-DC converter, an inverter, or the like has various requirements, such as small size and a small number of components, low ON resistance, low switching loss, and a low surge voltage.

A switching circuit such as that described above uses MOSFETs, IGBTs, or the like. The switching circuit switches these transistors between an ON state and an OFF state by switching a gate voltage applied to the gate terminal, or in other words, a gate electrode, of each transistor. The speed of the switch, or in other words, the switching speed, is dependent on the parasitic capacity of the transistors, or in other words, the input capacity Ciss, the feedback capacity Crss, the output capacity Coss, as well as the resistance value of the gate resistor connected to the gate terminal. The input capacity Ciss is the sum of the gate-source capacity Cgs and the gate-drain capacity Cgd. The feedback capacity Crss corresponds to the gate-drain capacity Cgd, and the output capacity Coss is the sum of the drain-source capacity Cds and the gate-drain capacity Cgd. The switching speed is typically set such that the surge voltage, which is generated by the inductance of an external circuit connected to the transistors, does not exceed the withstand voltage of the transistors. A surge voltage Vsu is determined from the following relational expression using inductance L and switching speed di/dt.

$$Vsu = L\,di/dt$$

This equation shows that in order to keep the surge voltage Vsu low, it is necessary to perform at least one of lowering the inductance L and reducing the switching speed di/dt. The inductance L is a value determined in accordance with the structure of the switching circuit, and it is therefore difficult to adjust the inductance L. The switching speed di/dt, on the other hand, can be controlled by adjusting the parasitic capacity and the resistance value of the gate resistor, as described above.

However, when the switching speed di/dt is reduced excessively with the aim of protecting the transistors from the surge voltage, another problem arises in that the switching loss at the switching circuit increases. Further, the parasitic capacity Ciss, Crss, Coss of the transistors varies according to the applied voltage, and therefore the switching speed di/dt must be adjusted taking this variation into account.

Another method of suppressing the surge voltage is to connect a snubber circuit between the drain and the source of the transistor, for example. However, a switching circuit for controlling a large amount of power (large current) requires a snubber circuit having large capacity, and therefore the overall cost of the switching circuit increases.

Japanese Laid-Open Patent Publication No. 2009-296216 discloses a switching circuit for reducing high-frequency noise and reducing an increase of switching loss. The switching circuit connects a drain electrode as a high voltage electrode of a transistor with a gate electrode, i.e., a gate terminal via a variable capacitor. Thus, for example, as the voltage between the drain electrode and the gate electrode increases, the prior art reduces the capacity of the capacitor.

An objective of the present invention is to provide a switching circuit that is capable of reducing switching loss and suppressing a surge voltage while controlling a large current with a compact configuration having a small number of components.

SUMMARY OF THE INVENTION

In accordance with one aspect of the present disclosure, a switching circuit includes a plurality of insulated gate transistors, gate resistors, a gate voltage application unit, and a capacitor. The insulated gate transistors are connected in parallel between a high voltage line and a low voltage line. Each gate resistor is connected to one of the plurality of insulated gate transistors. Each of the gate resistors includes a first terminal and a second terminal. The first terminal of each of the gate resistors is connected to the respective gate electrode of each of the plurality of insulated gate transistors. The gate voltage application unit is configured to apply pulsing gate voltage to the gate electrode of each of the plurality of insulated gate transistors. The gate voltage application unit is connected to the second terminal of each of the gate resistor via a gate voltage apply line. The capacitor is connected to a single location between the gate voltage apply line and the high voltage line.

According to this configuration, the plurality of insulated gate transistors are connected in parallel between the high voltage line and the low voltage line, and the first terminal of each gate resistor is connected to the gate electrode of each insulated gate transistor. Further, the second terminal of the gate resistor provided for each of the plurality of insulated gate transistors is connected to the gate voltage application unit via the gate voltage apply line, and the gate voltage application unit applies the pulsing gate voltage to the gate electrode of each insulated gate transistor via the corresponding gate resistor. As a result, the switching circuit can control a large current.

Further, the capacitor is connected to a single location between the gate voltage apply line and the high voltage line. By providing the capacitor, capacity variation between the gate electrodes of the insulated gate transistors and the high voltage line during gate voltage switching is suppressed. Hence, according to this configuration, switching loss can be reduced and a surge voltage can be suppressed with a compact configuration having a small amount of components.

In accordance with one aspect, the insulated gate transistors are MOSFETs in the switching circuit.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

One embodiment of the present disclosure will be described below with reference to FIGS. 1 and 2.

Figure 1:
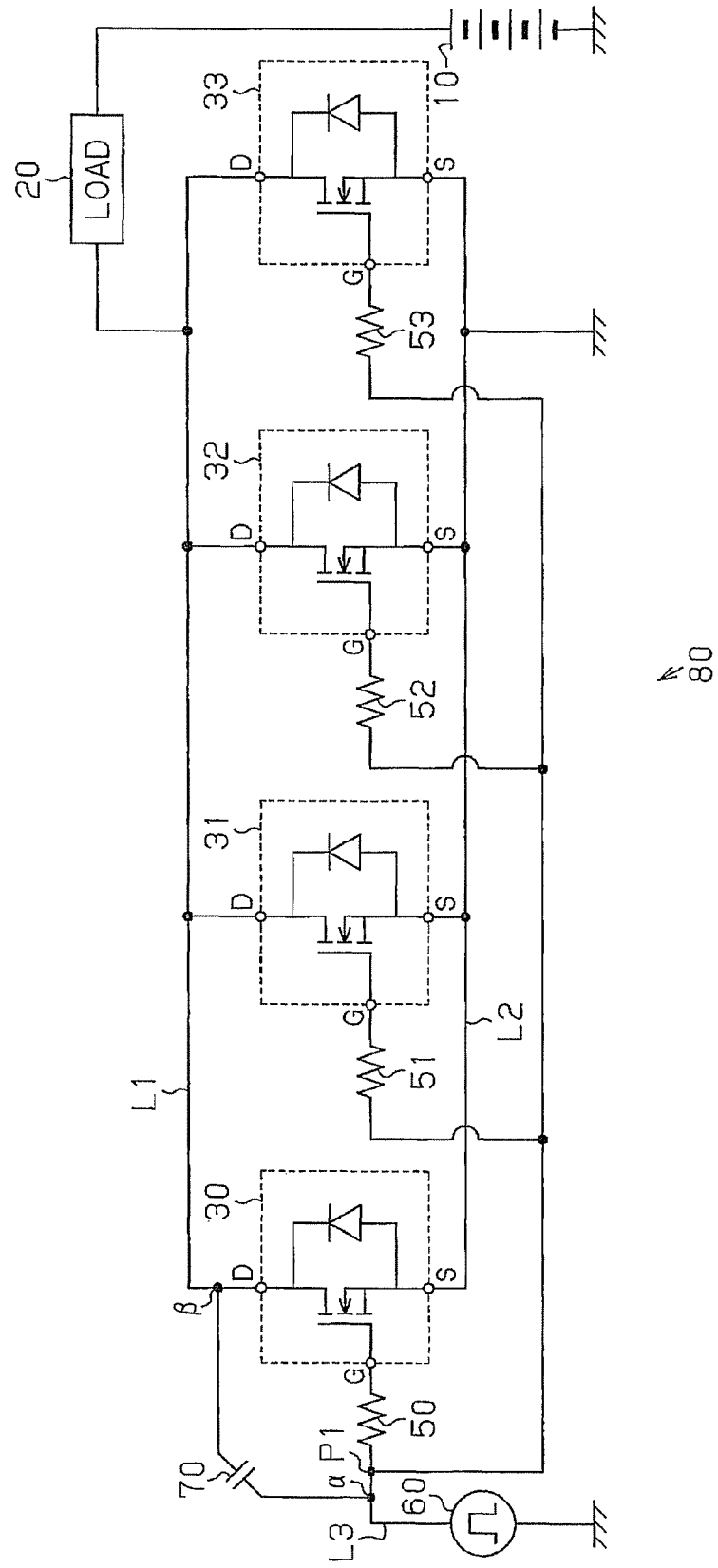
FIG. 1 is a circuit configuration diagram showing a switching circuit according to one embodiment.

FIG. 1 is a circuit diagram of a switching circuit 80. The switching circuit 80 includes four MOSFETs 30, 31, 32, 33, gate resistors 50, 51, 52, 53 connected to gate electrodes of the respective MOSFETs 30, 31, 32, 33, a single pulse generator 60, and a single capacitor 70. The switching circuit 80 is connected to a load 20 which is connected to a direct current power supply 10.

As shown in FIG. 1, a negative electrode terminal of the direct current power supply 10 is grounded. The positive electrode terminal of the direct current power supply 10 is connected to one end of the load 20. The other end of the load 20 is connected to the drain terminals of the MOSFETs 30, 31, 32, 33, which serve as a plurality of insulated gate transistors connected in parallel, by a high voltage line L1. The source terminals of the MOSFETs 30, 31, 32, 33 connected in parallel are grounded by a low voltage line L2. In other words, the four MOSFETs 30, 31, 32, 33 are connected in parallel between the high voltage line L1 and the low voltage line L2. In this embodiment, the load 20 is a motor driven by a large current.

In this embodiment, main electrodes of the transistors are the drain electrodes and the source electrodes of the respective MOSFETs 30, 31, 32, 33.

Each of the MOSFETs 30, 31, 32, 33 is a single chip element, and the respective chips, i.e., the MOSFETs 30, 31, 32, 33, are mounted on a substrate. The substrate on which the MOSFETs 30, 31, 32, 33 are mounted is also installed with other components, namely the gate resistors 50, 51, 52, 53, the capacitor 70, and the pulse generator 60.

The gate resistors 50, 51, 52, 53 are provided respectively on the MOSFETs 30, 31, 32, 33 such that respective first terminals of the gate resistors 50, 51, 52, 53 are connected to the respective gate electrodes of the MOSFETs 30, 31, 32, 33. More specifically, in FIG. 1, the first terminal of the gate resistor 50 is connected to the gate electrode of the MOSFET 30, the first terminal of the gate resistor 51 is connected to the gate electrode of the MOSFET 31, the first terminal of the gate resistor 52 is connected to the gate electrode of the MOSFET 32, and the first terminal of the gate resistor 53 is connected to the gate electrode of the MOSFET 33.

The pulse generator 60, which serves as a gate voltage application unit, is configured to apply a pulsing gate voltage to the respective gate electrodes of the MOSFETs 30, 31, 32, 33 via the gate resistors 50, 51, 52, 53. The pulse generator 60 includes a gate voltage apply line L3 for applying the gate voltage. The gate voltage apply line L3 splits at a branch point P1 and connects the pulse generator 60 to each of second terminals of the gate resistors 50, 51, 52 and 53 of the respective MOSFETs 30, 31, 32 and 33 via a branch point P1. That is, each of the gate resistors 50, 51, 52 and 53 provided respectively to the MOSFETs 30, 31, 32 and 33 has a second terminal. Each second terminal of the gate resistors 50, 51, 52 and 53 is connected to the pulse generator 60 via the gate voltage apply line L3. In other words, the gate voltage apply line L3 includes a pre-branch part between the pulse generator 60 and the branch point P1 and a post-branch part between the branch point P1 and the gate resistors 50, 51, 52, 53.

When the pulse generator 60 applies the pulsing gate voltage to the gate electrodes of the respective MOSFETs 30, 31, 32, 33 via the gate voltage apply line L3, the four MOSFETs 30, 31, 32, 33 are switched ON and OFF synchronously. Specifically, each of the MOSFETs 30, 31, 32 and 33 is switched to the ON state or OFF state, and supplies current to the load 20 during the ON state. That is, the pulse generator 60 switches the gate voltage applied to each gate electrode of the MOSFETs 30, 31, 32 and 33 connected in parallel between the high voltage line L1 and the low voltage line L2. By doing so, the pulse generator 60 switches the electrical connection between the source and the drain electrode of each of the MOSFETs synchronously from a conducting state to a non-conducting state or from a non-conducting state to a conducting state periodically.

Further, the single capacitor 70 is connected between the gate voltage apply line L3 and the high voltage line L1. More specifically, in FIG. 1, a connection point α serving as a first connection point is positioned between the pulse generator 60 and the branch point P1 on the gate voltage apply line L3, or in other words in the pre-branch part of the gate voltage apply line L3. A connection point β serving as a second connection point is positioned immediately before the drain electrode of the MOSFET 30 on the high voltage line L1. In other words, the connection point β is connected to the respective drain electrodes of the MOSFETs 30, 31, 32, 33. The single capacitor 70 is connected between the connection point α and the connection point β. More specifically, a first terminal of the capacitor 70 is connected to the connection point α and a second terminal of the capacitor 70 is connected to the connection point β. The capacity of the capacitor 70 is approximately 3 nF, for example. As described above, the capacitor 70 is likewise installed on the substrate mounted with the MOSFETs 30, 31, 32, 33, and the like.

Operation of the switching circuit 80 will be described below.

The pulse generator 60 applies high level gate voltage greater than or equal to On-voltage to each MOSFET in the OFF state of the MOSFETs 30, 31, 23 and 33. Then MOSFETs 30-33 in the OFF state will be switched to the ON state, or turned on, to supply current to the load 20.

When the MOSFETs 30, 31, 32, 33 are in the ON state, on the other hand, the pulse generator 60 applies an L level gate voltage to the gate electrode of each MOSFET. Then, the MOSFETs 30-33 in the ON state will be switched to the OFF state, or turned off, to interrupt current to the load 20. By performing this operation repeatedly, the pulse generator 60 outputs a pulse current.

Operations of the MOSFETs 30, 31, 32, 33 will be described in detail below.

Figure 2:
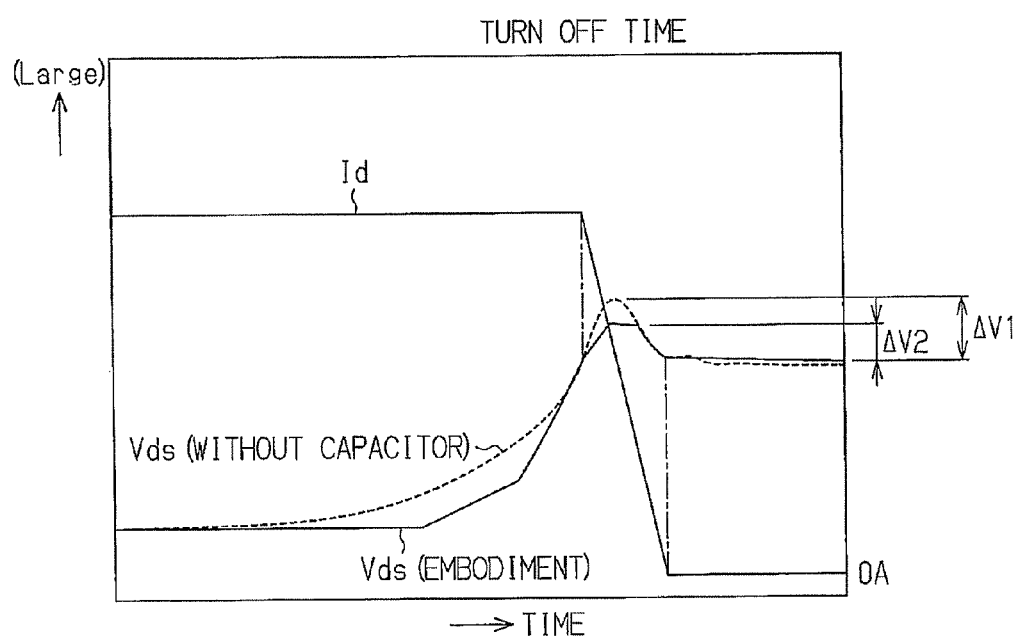
FIG. 2 is a waveform diagram illustrating operation of the switching circuit shown in FIG. 1.

FIG. 2 shows a current waveform and a voltage waveform of the MOSFETs 30, 31, 32, 33 provided in the switching circuit 80 of FIG. 1 in a turned-off state. The abscissa in FIG. 2 shows time. Time dependences of the drain-source voltage Vds and the drain current ID in a turned-off state are shown as a voltage waveform and a current waveform, respectively.

In FIG. 1, the single capacitor 70 is connected between the gate voltage apply line L3 and the high voltage line L1. FIG. 2 also shows the result of the configuration without the capacitor 70 of FIG. 1 for comparison.

In FIG. 2, the broken line shows a Vds waveform of the MOSFET of the switching circuit without the capacitor 70 between the gate voltage apply line L3 and the high voltage line L1, while the solid line shows a Vds waveform of the MOSFET of the switching circuit 80 with the capacitor 70 of the present embodiment.

During operation of the MOSFETs, the parasitic capacities Ciss, Crss are charged or discharged. For example, when the MOSFET attempts to turn OFF, the voltage applied between the drain and the gate gradually increases. More specifically, for example, when the transistor ON state switches to the turned-off state, the drain voltage Vd varies from 0 volts to 48 volts, the gate voltage Vg varies from 15 volts to 0 volts, and the source voltage Vs remains at 0 volts. In other words, when the transistor ON state switches to the turned-off state, an absolute value of a voltage difference between the drain and the gate varies from 15 volts to 48 volts.

When the capacitor 70 is not provided between the gate voltage apply line L3 and the high voltage line L1, the parasitic capacity between the drain and the gate, or in other words the feedback capacity Crss, decreases greatly as the drain-source voltage Vds increases. This phenomenon is a characteristic of the MOSFET. Hence, at the moment when the transistor is turned OFF, or in other words, in a part where the drain-source voltage Vds rises, the parasitic capacity between the drain and the gate is small, and therefore the drain current Id varies momentarily. As a result, di/dt, which is a time derivative of the drain current Id, increases such that the surge voltage becomes extremely large. See Vsu=L di/dt. That is to say, FIG. 2 shows a surge voltage ΔV1 evaluated from the broken line (without the capacitor 70), where the surge voltage is the difference between the maximum value of the Vds during the turned-off state and the Vds during a stabilization state after the turned-off state.

When the capacitor 70 is provided between the gate voltage apply line L3 and the high voltage line L1, as in this embodiment, the capacity of the capacitor 70 is added to the parasitic capacity between the drain and the gate, i.e., the feedback capacity Crss. In this case, a change, i.e., reduction of the capacity between the drain and the gate caused by an increase of the drain-source voltage Vds is prevented. Hence, according to this embodiment, in contrast to the case shown in FIG. 3, the surge voltage does not have to be taken into consideration when selecting a gate resistance value corresponding to a final value of the feedback capacity Crss resulting from an increase in the drain-source voltage Vds. Since the capacity between the drain and the gate does not change so much (does not reduce) even with increasing the drain-source voltage Vds, a rise time of the drain-source voltage Vds is shortened. Further, the surge voltage generated when the drain-source voltage Vds rises can be suppressed. As shown in FIG. 2, the surge voltage ΔV2 evaluated from the waveform of the drain-source voltage Vds indicated by the solid line is smaller than the surge voltage ΔV1 evaluated from the waveform of the drain-source voltage Vds indicated by the broken line.

In FIG. 2, the drain-source voltage Vds with the capacitor, i.e. according to this embodiment, is shaped to fall below the voltage Vds without the capacitor over time. In other words, Vds indicated by the solid line decreases below Vds indicated by the broken line over time, and a maximum value of Vds on the solid line is smaller than a maximum value of Vds on the broken line. A loss at the switching circuit 80, or in other words a switching loss, corresponds to an integrated value of the drain-source voltage Vds and the drain current Id. In the turned-off state, the Vds waveform according to this embodiment, indicated by the solid line in FIG. 2, varies sharply in contrast to the gentle variation of the Vds waveform according to the comparative example, indicated by the broken line. In other words, an incline of Vds indicated by the broken line varies gently, whereas an incline of the Vds waveform indicated by the solid line varies in steps. Hence, the switching loss according to this embodiment can be reduced below that of the comparative example.

In this embodiment, the capacitor 70 provided between the gate voltage apply line L3 and the high voltage line L1 reduces variation in the drain-gate capacity accompanying variation in the drain-source voltage Vds. In other words, the switching circuit 80 according to this embodiment is less likely to be affected by variation in the parasitic capacity between the drain and the gate. As a result, since the switching speed can be determined without considering the effect of the change of capacity so that the switching speed is not too slow, switching loss may be reduced.

Figure 3:
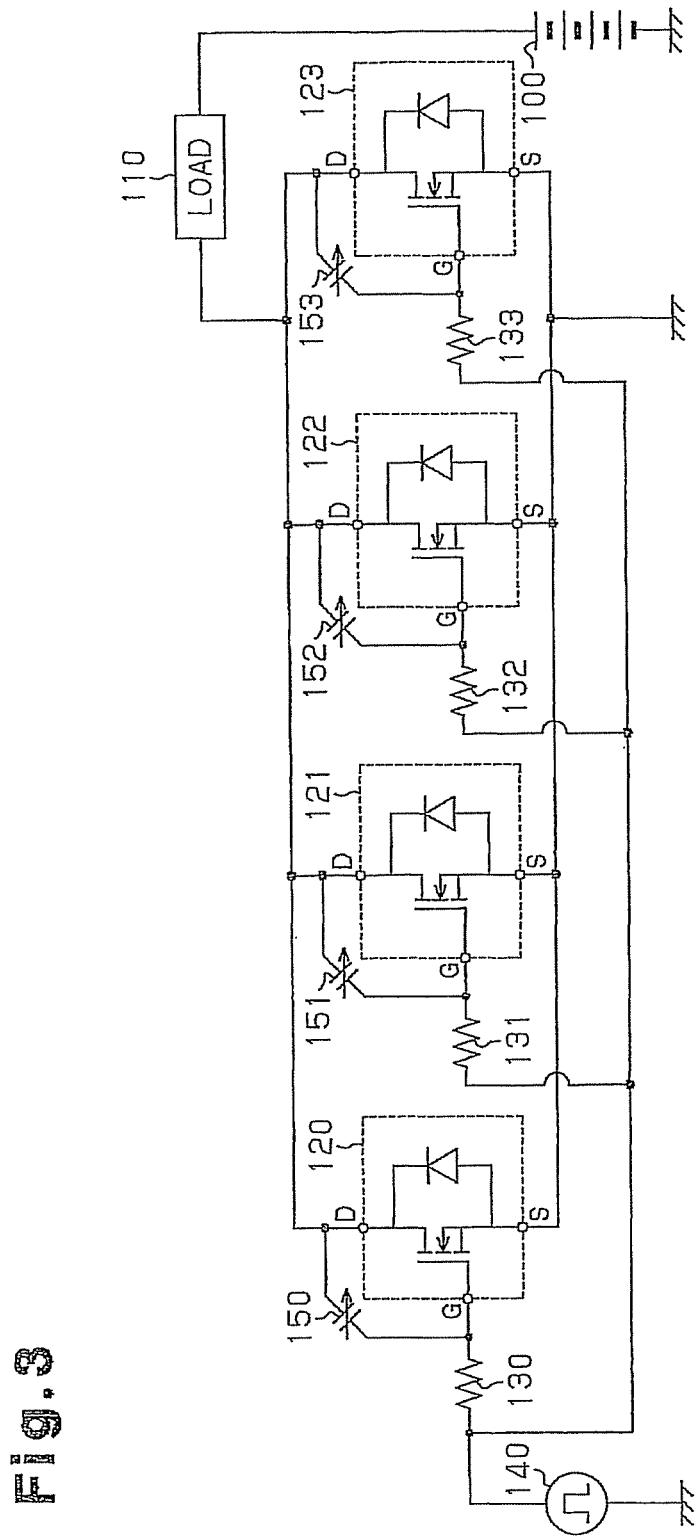
FIG. 3 is a circuit configuration diagram showing a typical switching circuit.

In contrast to the switching circuit shown in FIG. 3, the switching circuit 80 according to this embodiment, shown in FIG. 1, is provided with the single capacitor 70. In other words, the capacitor 70 is connected to a single location between the gate voltage apply line L3 and a drain line, i.e. the high voltage line L1. More specifically, the capacitor 70 electrically connects the high voltage line L1 to the gate voltage apply line L3. It is possible with this configuration to prevent an imbalance between the transistors (between the chips). With the configuration shown in FIG. 1, the number of installed capacitors can be reduced in comparison with the configuration shown in FIG. 3. By reducing the number of capacitors, a mounting surface area of the capacitors can also be reduced. As a result, reductions in size and cost are achieved.

According to this embodiment, as described above, the following effects are obtained.

In the switching circuit 80, the respective first terminals of the gate resistors 50, 51, 52, 53 are connected to the gate electrodes of the respective MOSFETs 30, 31, 32, 33. The second terminal of each of the gate resistors 50, 51, 52 and 53 connected to corresponding one of MOSFETs 30, 31, 32 and 33 is connected to the pulse generator 60 via the gate voltage apply line L3. The pulse generator 60 applies pulsing gate voltages to the gate electrode of the respective MOSFETs 30, 31, 32, 33 via the gate resistors 50, 51, 52, 53, and therefore the plurality of MOSFETs 30, 31, 32, 33 are operated to turn ON and OFF in synchronization with each other. As a result, the switching circuit can control a large current. Further, the capacitor 70 is connected to a single location between the gate voltage apply line L3 and the high voltage line L1. By providing the capacitor 70, capacity variation between the gate electrodes of the MOSFETs 30, 31, 32, 33 and the high voltage line L1 during gate voltage switching is suppressed. Hence, the switching circuit according to the present disclosure can reduce switching loss and suppress a surge voltage with a compact configuration having a small number of components.

As shown in FIG. 3 of the present application, for example, a switching circuit for controlling a large amount of power (large current) is constituted by a direct current power supply 100, a load 110, and a plurality of transistors 120, 121, 122, 123 connected in parallel.

The gate electrodes of the transistors 120, 121, 122, and 123 are connected to a pulse generation circuit 140, which serves as a gate voltage application circuit, via respective gate resistors 130, 131, 132, and 133. When an ON voltage is applied to the gate electrodes of the respective transistors 120, 121, 122, 123 from the pulse generation circuit 140, the respective transistors 120, 121, 122, 123 are switched ON, whereby a current flows to the load 110, or in other words the load is driven. When the transistors 120, 121, 122, 123 connected in parallel are used in this manner, a current flowing to each transistor can be reduced in comparison with a case where a single transistor is used, for example. Thus, even though current capacity of each transistor is small, it enables the load to receive large current via a plurality of transistors connected in parallel.

In this type of switching circuit using a plurality of transistors connected in parallel, variable capacitors 150, 151, 152, 153 are connected to the respective transistors 120, 121, 122, 123 between the gate electrode and a drain electrode thereof in order to reduce switching loss and suppress the surge voltage in the configurations of Japanese Laid-Open Patent Publication No. 2009-296216, as shown in FIG. 3 of the present application. In this case, an increase occurs in the number of components, leading to an increase in the overall size of the switching circuit. For example, if only one transistor among four transistors 120, 121, 122 and 123 has a variable capacitor between the gate and drain electrode to reduce a number of components as shown in Japanese Laid-Open Patent Publication No. 2009-296216, there would be a problem in that current imbalance between transistors is caused upon driving the switching circuit to cause overheat and huge surge voltage in the switching circuit.

The present invention is not limited to the embodiment described above and may be modified as follows, for example.

In the above embodiment, the four MOSFETs 30, 31, 32, 33 are connected in parallel between the high voltage line L1 and the low voltage line L2. However, there are no limitations on the number of MOSFETs, and a number other than four, for example two, three, five, or more, i.e. any plurality of MOSFETs, may be connected in parallel.

IGBTs may be used as the insulated gate transistors in place of the MOSFETs 30, 31, 32, 33 serving as the insulated gate transistors. A collector electrode and an emitter electrode constitute main electrodes of an IGBT.

The aforesaid connection point α may be the branch point P1, or may exist in the post-branch part of the gate voltage apply line L3.

The aforesaid connection point β does not have to be provided immediately before the MOSFET 30 as long as it exists on the high voltage line L1.

The invention claimed is:

1. A switching circuit comprising:
    a plurality of insulated gate transistors connected in parallel between a high voltage line and a low voltage line;
    gate resistors, each being connected to one of the plurality of insulated gate transistors, wherein each of the gate resistors includes a first terminal and a second terminal, the first terminal of each of the gate resistors being connected to the respective gate electrode of each of the plurality of insulated gate transistors;
    a gate voltage application unit configured to apply pulsing gate voltage to the gate electrode of each of the plurality of insulated gate transistors, the gate voltage application unit being connected to the second terminal of each of the gate resistor via a gate voltage apply line; and
    a single fixed-value capacitor connected to a single location between the gate voltage apply line before or at the second terminal of one of the gate resistors and the high voltage line, wherein the single fixed-value capacitor substantially suppresses a surge voltage that is generated when the plurality of insulated gate transistors is synchronously turned off.

2. The switching circuit according to claim 1, wherein the insulated gate transistors are MOSFETs.

3. The switching circuit according to claim 1, wherein the gate voltage application unit is configured to turn on and off the plurality of insulated gate transistors in synchronization with each other.

4. The switching circuit according to claim 1, wherein the plurality of insulated gate transistors, the gate resistors, and the single fixed-value capacitor are mounted on a single substrate.

5. The switching circuit according to claim 1, further comprising a load having a first end and a second end, wherein the first end of the load is connected to a direct current power supply, and the second end of the load is connected to the high voltage line.

6. The switching circuit according to claim 5, wherein the load is a motor driven by a large current.

7. The switching circuit according to claim 1, wherein,
    when the plurality of insulated gate transistors are turned on synchronously, current is supplied to a load; and
    when the plurality of insulated gate transistors are turned off synchronously, current to the load is interrupted.

8. The switching circuit according to claim 1, wherein
    the single fixed-value capacitor includes a first terminal and a second terminal;
    the first terminal of the single fixed-value capacitor is connected to the gate voltage apply line that connects the gate voltage application unit to the second terminal of each of the gate resistors; and
    the second terminal of the single fixed-value capacitor is connected to the high voltage line that connects to a power supply via a load.

* * * * *